Aug. 27, 1968 S. B. GRAY 3,399,312

MULTIPLIER/DIVIDER CIRCUIT

Filed May 5, 1965

*INVENTOR*
STEPHEN B. GRAY

*BY* Stanley M. Schurgin

*ATTORNEY*

3,399,312
Patented Aug. 27, 1968

3,399,312

MULTIPLIER/DIVIDER CIRCUIT

Stephen B. Gray, Newton, Mass., assignor to Sylvania Electric Products Inc., a corporation of Delaware Filed May 5, 1965, Ser. No. 453,402
3 Claims. (Cl. 307—229)

ABSTRACT OF THE DISCLOSURE

A multiplier/divider circuit employing transistors operating in the saturation region wherein the collector-emitter voltage is a linear function of collector current and base current. A single transistor stage is employed in a feedback arrangement with a differential operational amplifier to provide multiplication.

This invention relates to electronic circuitry and more particularly to multiplier/divider circuits.

In the processing of electrical signals, it is often necessary to multiply or to divide two signals. A variety of circuits have been evolved to perform these operations and these circuits are quite adequate for some purposes. However, in many situations these known circuits are not suitable for one reason or another. For example, highly accurate circuits are generally complex and slow in response. High speed circuits are also complex as they usually employ logarithmic techniques for adding or subtracting logarithmic versions of the signals being operated upon. In many instances, extreme accuracy or speed are unnecessary and much less complex circuitry would suffice.

It is, therefore, an object of the invention to provide an extremely simple and efficient multiplier/divider circuit.

In accordance with the present invention, a transistor stage operating in the saturation region comprises a single element division circuit wherein the output voltage is proportional to the quotient of the collector current and base current. This transistor stage is then employed in a feedback arrangement with a differential operational amplifier to provide multiplicative operation.

The invention will be more fully understood from the following detailed description, taken in conjunction with the accompanying drawings, in which.

Applicant has recognized, and the present invention is based thereon, that certain transistors operating in the saturation region function as a divider. Referring to the collector characteristics of a PNP alloy junction transistor illustrated in FIG. 1, it is seen from the equal spacing of the curves along any ordinate that in the saturation region the collector current $I_c$ is proportional to the base current $I_b$, for a constant $V_{CE}$. It is also evident from the linearity of the curves that the collector current is proportional to $V_{CE}-V_o$, for a given base current. These relations can be combined to give $$V_{CE}=V_p\frac{I_c}{I_b}+V_o \qquad (1)$$

where $V_o$ is the offset voltage and $$V_b \text{ is } \frac{V_{sat}-V_o}{\beta_{sat}}$$

Figure 2A:
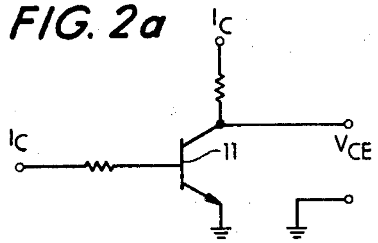
FIG. 2A is a schematic diagram of a divider circuit according to the present invention.

Thus, the collector-emitter voltage is a linear function of the quotient of collector current and base current. Such a transistor configuration is illustrated in FIG. 2A wherein the collector-emitter voltage $V_{CE}$ of a transistor 11, operated in saturation, is proportional to the ratio of collector current to base current. Germanium and silicon transistors, both PNP and NPN, can be employed, typical types being 2N404, 2N501, 2N593 and 2N596.

For a constant base current, the collector current is proportional to $V_{CE}-V_o$ to an accuracy of about 10%, while for a constant $V_{CE}$, the proportionality between collector and base current is accurate to approximatel) 3%. These orders of accuracy are completely satisfactory for many applications.

Figure 1:
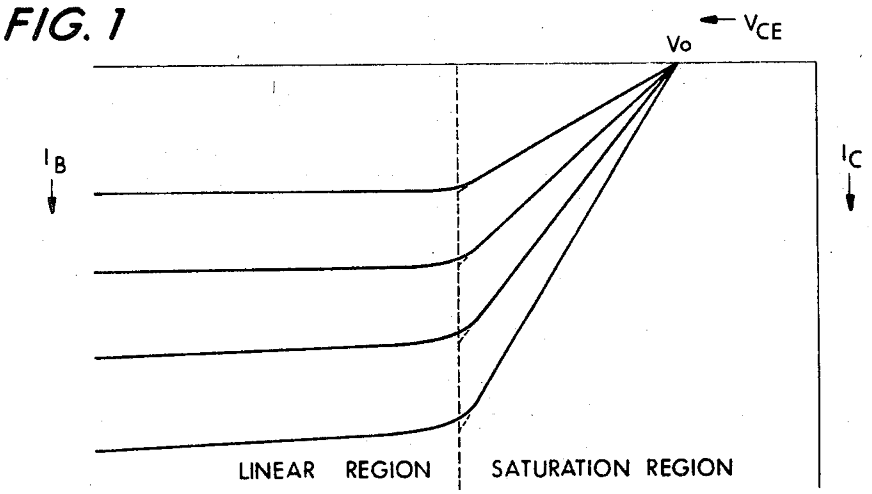
FIG. 1 is a plot of the collector characteristics of a transistor of the type useful in the present invention.
Figure 2B:
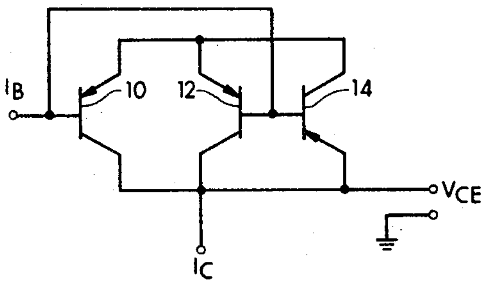
FIG. 2B is a schematic diagram of a compound transistor useful in the present invention.

As seen in FIG. 1, the collector characteristics become curved in the region between saturated and linear operation, which causes non-linearity in the output voltage. Linearity can be improved by employing a compound transistor whose collector characteristics are substantially linear throughout the saturation region. Such a compound transistor is shown in FIG. 2B and includes a pair of transistors 10 and 12 whose respective collector and emitter are interconnected, the combined emitters and collectors being connected, respectively, to the collector and emitter of a third transistor 14. The bases of the three transistors are commonly connected and the three-transistor combination functions as a single active element. While this compound element is slower than the single transistor version, the improved linearity, as depicted by the dotted lines in FIG. 1, is more desirable than speed in many instances. Three 2N501 transistors are typical ones which can be used to provide the requisite operation.

Figure 3:
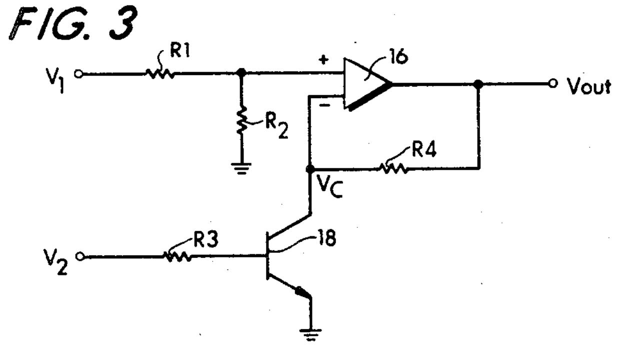
FIG. 3 is a schematic diagram of a multiplier circuit according to the invention.

It will be noted that the collector current is equal to the product of collector voltage and base current; thus, the above-described transistor stage can also function as a multiplier. In utilizing this circuit as a multiplier, however, some means must be provided to couple out collector current without disturbing the collector voltage input. This is accomplished, according to the invention, by utilizing a differential operational amplifier in the configuration illustrated in FIG. 3. The operational amplifier may be any one of the well known types having a high gain and high input impedance, such as the commercially available models P–45 or P–65 of George A. Philbrick Researches Inc., or Burr-Brown models 1503 and 1608. Referring to FIG. 3, there is shown a differential operational amplifier 16 connected in circuit with a transistor 18. A first input voltage $V_1$ is applied via resistive divider R1 and R2 to the positive input terminal of operational amplifier 16. A second input voltage $V_2$ is applied through a resistor R3 to the base of transistor 18, the collector of which is connected to the negative input terminal of amplifier 16. A feedback resistor R4 is connected between the output of amplifier 16 and its negative input terminal.

The circuit operates in the following manner. Operational amplifier 16 has a very high gain and input impedance and its output voltage is a greatly amplified version of the difference between the input voltages. Since the gain of such amplifiers is of the order of 100,000 and its output voltage has a maximum level of say ten volts, the negative feedback signal provided via resistor R4 tends to maintain the input voltage to the negative input terminal very nearly the same magnitude as the input signal to the positive terminal so that the maximum output level is not exceeded. Thus, the collector-emitter voltage $V_{CE}$ of transistor 18 approximates the voltage applied to the positive input terminal. Due to the high input impedance of the operational amplifier, it draws essentially no current, and the collector current $I_C$ is a function of the amplifier output voltage and feedback resistor R4, i.e.

$$I_c=\frac{V_{out}-V_1}{R4} \qquad (2)$$

Due to the low operating voltage $V_c$ at the collector of transistor 18, $V_{out}>>V_c$, therefore $$I_c\approx\frac{V_{out}}{R4} \qquad (3)$$

or, transposing, $$V_{out}\approx I_c R4 \qquad (4)$$

The base-emitter voltage $V_{BE}$ is near ground potential and $V_2>>V_{BE}$, therefore the base current is $$I_b=\frac{V_2}{R3} \qquad (5)$$

Combining Equations 2–5, the output voltage in terms of the input voltages is expressed as $$V_{out}=V_1V_2\left(\frac{R4}{R3V_p}\right) \qquad (6)$$

where $V_p$ is a constant for a particular transistor as defined in Equation 1.

Alternatively, the multiplier can be described in terms of a normalized transfer function, $$\frac{V_{out}}{V_{out\,p}}=\left(\frac{V_1}{V_{1p}}\right)\left(\frac{V_2}{V_{2p}}\right) \qquad (7)$$

where $V_{out\,p}$, $V_{1p}$ and $V_{2p}$ are peak values of the input and output voltages.

For proper multiplicative operation, the foregoing circuit requires that both input voltages be positive. However, if a symmetrical transistor is employed, such as a 2N596, wherein collector and emitter are interchangeable, the input voltage $V_1$ can be either positive or negative. When $V_1$ is positive, current flows into the collector and out of the emitter. When $V_1$ is negative, current flows into the emitter and out of the collector through resistor R4, causing the output voltage $V_{out}$ to be negative. In this case, it will be noted that base current $I_b$ also flows through resistor R4; however if $I_b$ is small the negative operation of the multiplier is not materially affected. The symmetrical transistor can be one of the known types, for example a 2N596, or symmetrical operation can be achieved by two conventional transistors of the same type, with the emitter and collector of one being connected respectively to the collector and emitter of the other, and the bases commonly connected, such as the connection of transistors 12 and 14 in FIG. 2.

From the foregoing, it is evident that an extremely simple and effective circuit has been provided wherein a transistor stage operated in saturation functions as a divider and this transistor stage connected in a feedback circuit with a differential operational amplifier operates as a multiplier. The invention is not to be limited by the particular embodiments shown and described, except as indicated in the appended claims.

What is claimed is:

1. A circuit comprising, a differential operational amplifier having first and second input terminals and an output terminal, means for applying a first signal to said first input terminal, transistor means connected to said second input terminal, feedback means connecting said output terminal and said second input terminal, and means for applying a second signal to said transistor means.

2. A multiplier circuit comprising, a differential operational amplifier having first and second input terminals and an output terminal, means for applying a first signal to said first input terminal, transistor means having first, second and third electrodes, said third electrode connected to said second input terminal, feedback means connecting said output terminal and said second input terminal, and means for applying a second signal to the first electrode of said transistor means, said first and second signals causing said transistor means to operate in saturation.

3. A divider circuit comprising first, second and third transistors each having a base, an emitter and a collector, the emitters and collectors of said first and second transistors being respectively interconnected, the collector and emitter of said third transistor being connected respectively to the interconnected emitters and collectors of said first and second transistors, the bases of all transistors being interconnected, and first and second current sources connected, respectively, to the combined bases, and the interconnected collectors of said transistors, and of a magnitude to operate said transistors in saturation.

References Cited

UNITED STATES PATENTS

| | | | |
|---|---|---|---|
| 3,300,631 | 1/1967 | Vallese | 308—160 X |
| 3,353,012 | 11/1967 | Baude | 235—194 |

ARTHUR GAUSS, *Primary Examiner.*
DONALD D. FORRER, *Assistant Examiner.*